US010991787B2

(12) United States Patent
Kishimoto

(10) Patent No.: US 10,991,787 B2
(45) Date of Patent: Apr. 27, 2021

(54) DISPLAY DEVICE AND METHOD OF MANUFACTURING THE SAME

(71) Applicant: Samsung Display Co. Ltd., Yongin-si (KR)

(72) Inventor: Hirotsugu Kishimoto, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 15/993,009

(22) Filed: May 30, 2018

(65) Prior Publication Data

US 2019/0131374 A1 May 2, 2019

(30) Foreign Application Priority Data

Oct. 26, 2017 (KR) .......... 10-2017-0140095

(51) Int. Cl.
H01L 51/52 (2006.01)
H01L 27/32 (2006.01)
H01L 23/00 (2006.01)
H01L 51/56 (2006.01)

(52) U.S. Cl.
CPC ........ H01L 27/3276 (2013.01); H01L 23/562 (2013.01); H01L 27/3272 (2013.01); H01L 51/5253 (2013.01); H01L 51/5284 (2013.01); H01L 51/56 (2013.01); H01L 27/323 (2013.01); H01L 51/529 (2013.01); H01L 51/5246 (2013.01); H01L 51/5281 (2013.01); H01L 2227/323 (2013.01); H01L 2251/5338 (2013.01)

(58) Field of Classification Search
None
See application file for complete search history.

(56) References Cited

U.S. PATENT DOCUMENTS

| 10,739,887 | B2* | 8/2020 | Odaka ............... H01L 27/124 |
| 2011/0182046 | A1* | 7/2011 | Shiota ................ H05K 3/323 361/760 |
| 2011/0199348 | A1* | 8/2011 | Takatani ........... G02F 1/13452 345/204 |
| 2016/0190502 | A1* | 6/2016 | Yang ................. H01L 51/524 257/40 |
| 2016/0307968 | A1* | 10/2016 | Yoon ................. H01L 27/323 |
| 2017/0186824 | A1* | 6/2017 | Lee .................. H01L 27/3223 |
| 2018/0053817 | A1* | 2/2018 | Kishimoto ......... H01L 51/5253 |

FOREIGN PATENT DOCUMENTS

| KR | 10-2007-0119239 A | 12/2007 |
| KR | 10-2016-0058284 A | 5/2016 |
| KR | 10-2017-0009637 A | 1/2017 |
| KR | 10-2017-0064161 A | 6/2017 |

* cited by examiner

Primary Examiner — Benjamin P Sandvik
(74) Attorney, Agent, or Firm — Innovation Counsel LLP

(57) ABSTRACT

Display device and method of manufacturing the display device are provided. According to an exemplary embodiment of the present disclosure, a display device includes a display panel having a display area and a pad area, which is spaced apart from the display area; a protective film disposed on one surface of the display panel; and a middle layer interposed between the protective film and the display panel, wherein the middle layer has a light-blocking area and a light-transmitting area, the light-blocking area overlaps with the display area, and the light-transmitting area overlaps with the pad area.

13 Claims, 12 Drawing Sheets

DISPLAY DEVICE AND METHOD OF MANUFACTURING THE SAME

This application claims priority to Korean Patent Application No. 10-2017-0140095, filed on Oct. 26, 2017, and all the benefits accruing therefrom under 35 U.S.C. § 119, the disclosure of which is incorporated herein by reference in its entirety.

BACKGROUND

1. Field

The present disclosure relates to a display device and a method of manufacturing the same.

2. Description of the Related Art

Display devices have increasingly become important in accordance with developments in multimedia technology. Accordingly, various types of display devices such as a liquid crystal display (LCD) device, an organic light-emitting display device, etc. have been used.

The LCD device, which is one of the most widely-used flat panel displays, includes two substrates on which field-generating electrodes such as pixel electrodes and a common electrode are formed and a liquid crystal layer which is interposed between the two substrates. The LCD device forms an electric field in the liquid crystal layer by applying voltages to the field-generating electrodes so as to determine the orientation of liquid crystal molecules in the liquid crystal layer, and displays an image by controlling the polarization of light incident thereupon using the electric field.

The organic light-emitting display device displays an image using light-emitting diodes (OLEDs), which generate light through the recombination of electrons and holes. The organic light-emitting display device has many advantages such as fast response speed, high luminance, wide viewing angle, and low power consumption.

SUMMARY

Exemplary embodiments of the present disclosure provide a display device capable of preventing wiring patterns from becoming visible due to the reflection of external light.

Exemplary embodiments of the present disclosure also provide a method of manufacturing a display device capable of preventing wiring patterns from becoming visible due to the reflection of external light.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, a display device includes: a display panel having a display area and a pad area, the pad area being spaced apart from the display area; a protective film disposed on one surface of the display panel; and a middle layer interposed between the protective film and the display panel, wherein the middle layer has a light-blocking area and a light-transmitting area, the light-blocking area overlaps with the display area, and the light-transmitting area overlaps with the pad area.

The display panel may further have a non-display area that is disposed outside the display area, and the light-blocking area may partially cover the non-display area.

Outer boundaries of the light-blocking area may be disposed inside outer boundaries of the non-display area.

The light-blocking area may only overlap with the display area.

The light-blocking area may include a light-blocking printed layer that is formed on the protective film.

The light-blocking printed layer may comprise a black pigment.

The display device may further include an adhesive layer covering the light-blocking printed layer and the protective film, wherein the light-transmitting area is provided by the adhesive layer.

The middle layer may include a light-blocking adhesive layer, and the light-blocking adhesive layer may have a light-transmitting area corresponding to the light-transmitting area of the middle layer and a light-blocking area corresponding to the light-blocking area of the middle layer.

One surface of the light-blocking adhesive layer may be placed in contact with the protective film, and the other surface of the light-blocking adhesive layer may be placed in contact with the display panel.

The display device may further include an impact absorbing layer disposed on one surface of the protective film.

The display device may further include an adhesive layer disposed between the impact absorbing layer and the protective film, wherein one surface of the adhesive layer is placed in contact with the impact absorbing layer and the other surface of the adhesive layer is placed in contact with the protective film.

The light-transmitting area may have a light transmittance of 50% or higher for light having a wavelength of 550 nm.

The light-blocking area may have a light transmittance of 10% or lower for light having a wavelength of 550 nm.

According to another exemplary embodiment of the present disclosure, a method of manufacturing a display device includes: forming a middle layer, which has a light-blocking area and a light-transmitting area, on a protective film; and bonding the protective film with the middle layer formed thereon and a display panel, wherein the display panel has a display area and a pad area, the pad area being spaced apart from the display area, the light-blocking area overlaps with the display area, and the light-transmitting area overlaps with the pad area.

The forming the middle layer may include forming, on the protective film, a light-blocking printed layer that partially covers the protective film.

The method may further include forming an adhesive layer on the light-blocking printed layer and the protective film.

The display panel may further have a non-display area that is disposed outside the display area, and the light-blocking area may partially cover the non-display area.

The light-blocking area may only overlap with the display area.

The light-transmitting area may have a light transmittance of 50% or higher for light having a wavelength of 550 nm.

The light-blocking area may have a light transmittance of 10% or lower for light having a wavelength of 550 nm According to the aforementioned and other exemplary embodiments of the present disclosure, wiring patterns can be prevented from becoming visible due to external light.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

Figure 1:
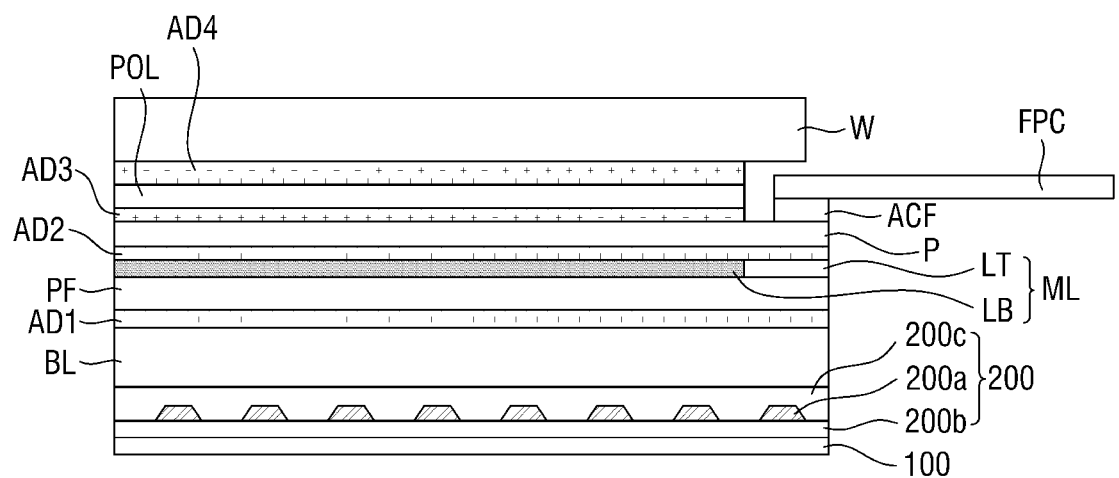
FIG. 1 is a cross-sectional view of a display device according to an exemplary embodiment of the present disclosure.

The advantages and features of the present inventive concept and methods for achieving the advantages and features will be apparent by referring to the embodiments to be described in detail with reference to the accompanying drawings. However, the present inventive concept is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the present inventive concept, and the present inventive concept is only defined within the scope of the appended claims.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween. In the entire description of the present inventive concept, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present inventive concept will be described with reference to the attached drawings.

Figure 2:
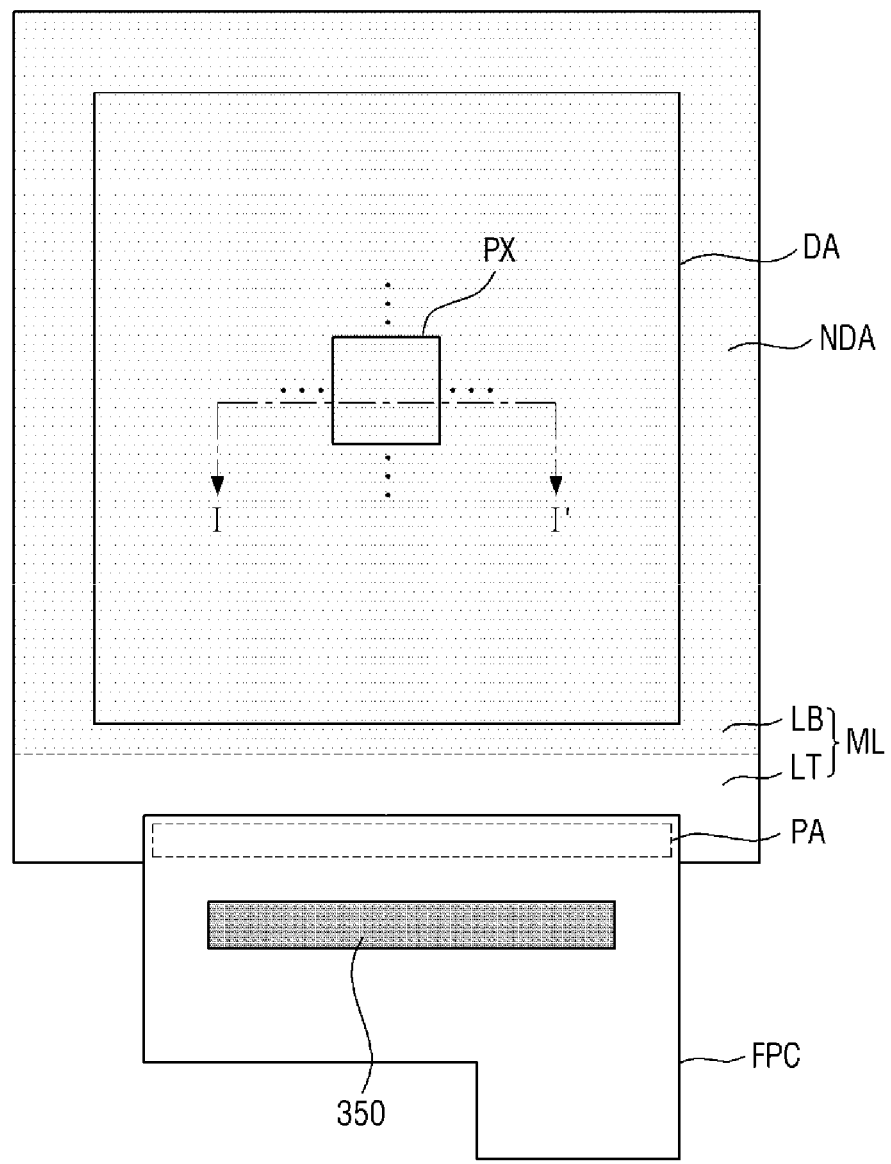
FIG. 2 is a layout view of the display device according to the exemplary embodiment of FIG. 1.

FIG. 1 is a cross-sectional view of a display device according to an exemplary embodiment of the present disclosure. FIG. 2 is a layout view of the display device according to the exemplary embodiment of FIG. 1.

Referring to FIGS. 1 and 2, the display device according to an exemplary embodiment of the present disclosure includes a display panel P, a protective film PF, and a middle layer ML. The display device according to an exemplary embodiment of the present disclosure may further include a heat dissipation layer 100, a wiring pattern layer 200, an impact absorbing layer BL, first, second, third, and fourth adhesive layers AD1, AD2, AD3 and AD4, a polarizing layer POL, and a window W.

The heat dissipation layer 100 may dissipate heat generated in the display panel P that will be described later. The heat dissipation layer 100 may be in the shape of a thin plate.

FIG. 1 illustrates an example in which the heat dissipation layer 100 is a single layer, but the present disclosure is not limited thereto. In another example, the heat dissipation layer 100 may be a stack of two or more layers.

In one exemplary embodiment, the heat dissipation layer 100 may include a thin film of a metal such as gold (Au), silver (Ag), or copper (Cu), or may comprise graphite and carbon nanotubes.

The wiring pattern layer 200 may be disposed on the heat dissipation layer 100. The wiring pattern layer 200 may include wiring patterns 200a and insulating layers (200b and 200c), which surround the wiring patterns 200a from above and below the wiring patterns 200a. Specifically, the wiring pattern layer 200 may include a first insulating layer 200b, the wiring patterns 200a, which are disposed on the top surface of the first insulating layer 200b, and a second insulating layer 200c, which covers the top surfaces of the wiring patterns 200a. The wiring patterns 200a may cover parts of the top surface of the first insulating layer 200b and may expose other parts of the top surface of the first insulating layer 200b. The second insulating layer 200c may be disposed not only on the top surface and the sides of each of the wiring patterns 200a, but also on the exposed parts of the top surface of the first insulating layer 200b.

The wiring patterns 200a may comprise a metal material such as Cu, Ag, nickel (Ni), or tungsten (W). Each of the wiring patterns 200a may be a single film or a stack of a plurality of films. In one exemplary embodiment, each of the wiring patterns 200a may be a double film consisting of a lower Cu film and an upper Cu film. The wiring patterns 200a may be wires or electrodes transmitting signals or may be floating wires or electrodes.

The first and second insulating layers 200b and 200c may be formed of an organic insulating material, an inorganic insulating material, or the combination thereof or may be formed of a bonding material such as an adhesive material.

In one exemplary embodiment, the wiring pattern layer 200 may be a digitizer. The digitizer, unlike an input device such as a keyboard or a mouse, receives information regarding a position on a screen, designated by a user. The digitizer recognizes the movement of, for example, a stylus pen, and converts the recognized movement into a digital signal. The digitizer may be provided in the form of a thin film or a panel.

The impact absorbing layer BL may be disposed on the wiring pattern layer 200. The impact absorbing layer BL may absorb an external impact and may thus prevent the display device according to an exemplary embodiment of the present disclosure from being damaged. The impact absorbing layer BL may comprise an elastic material such as a polyurethane (PU) or polyethylene (PE) resin. In one exemplary embodiment, the impact absorbing layer BL may be a cushion layer.

A first adhesive layer AD1 may be disposed on the wiring pattern layer 200.

The first adhesive layer AD1 may be disposed between the impact absorbing layer BL and the protective film PF and may bond the impact absorbing layer BL and the protective film PF together. That is, one surface of the first adhesive layer AD1 may be placed in contact with the impact absorbing layer BL, and the other surface of the first adhesive layer AD1 may be placed in contact with the protective film PF.

In one exemplary embodiment, the first adhesive layer AD1 may comprise a photocurable resin or a thermosetting resin having a high transmittance and an adhesive performance. For example, the first adhesive layer AD1 may be obtained by applying a resin such as an acrylic resin and irradiating the resin with ultraviolet (UV) light so as to cure the resin.

In one exemplary embodiment, the first adhesive layer AD1 may include a pressure sensitive adhesive (PSA).

In one exemplary embodiment, the first adhesive layer AD1 may include an optically clear adhesive (OCA).

In one exemplary embodiment, the first adhesive layer AD1 may have a thickness of 10 μm to 200 μm.

The protective film PF may be disposed on the first adhesive layer AD1. The protective film PF may be attached to the bottom of the display panel P and may thus protect the display panel P. In one exemplary embodiment, the protective film PF may be formed of at least one material selected from among polyethylene terephthalate (PET), polyethylene naphthalate (PEN), polyethylene sulfide (PES), and PE.

The middle layer ML may be disposed on the protective film PF. The middle layer ML may be disposed between the protective film PF and the display panel P.

The middle layer ML may have a light-blocking area LB and a light-transmitting area LT.

The light-blocking area LB may absorb or reflect light provided from the outside. The light-transmitting area LT may transmit light provided from the outside therethrough.

In one exemplary embodiment, the light-blocking area LB may have a light transmittance of 10% or lower for light having a wavelength of 550 nm, but the present disclosure is not limited thereto. That is, in another exemplary embodiment, the light-blocking area LB may have a light transmittance of 1% or lower for light having a wavelength of 550 nm because the lower the transmittance of the light-blocking area LB, the better in terms of the advantageous effects of the inventive concept of the present disclosure.

In one exemplary embodiment, the light-transmitting area LT may have a light transmittance of 50% or higher for light having a wavelength of 550 nm. In a case where the light-transmitting area LT has a light transmittance of 50% or higher, the display panel P can become visible from below the protective film PF, and as a result, the alignment of the protective film PF and the display panel P can be facilitated.

A second adhesive layer AD2 may be disposed on the middle layer ML. The second adhesive layer AD2 may bond the middle layer ML and the display panel P together.

In one exemplary embodiment, the second adhesive layer AD2 may comprise a photocurable resin or a thermosetting resin having a high transmittance and an adhesive performance. For example, the second adhesive layer AD2 may be obtained by applying a resin such as an acrylic resin and irradiating the resin with UV light so as to cure the resin.

In one exemplary embodiment, the second adhesive layer AD2 may include a PSA.

In one exemplary embodiment, the second adhesive layer AD2 may include an OCA.

In one exemplary embodiment, the second adhesive layer AD2 may have a thickness of 10 μm to 200 μm.

The display panel P may be disposed on the second adhesive layer AD2. In one exemplary embodiment, the display panel P may be a display panel for use in an organic light-emitting display device, but the present disclosure is not limited thereto. In another exemplary embodiment, the display panel P may be a display panel for use in a liquid crystal display (LCD) device or another type of display device.

Examples of the display panel P will be described later with reference to FIGS. 7 and 8.

Referring again to FIG. 2, the display panel P may have a display area DA, a non-display area NDA, and a pad area PA.

The display area DA is defined as an area in which to display an image. In the display area DA, a plurality of pixel units PX for realizing an image may be disposed.

The non-display area NDA is disposed on the outside of the display area DA and is defined as an area in which no image is displayed. In one exemplary embodiment, the non-display area NDA may be disposed to surround the display area DA. FIG. 2 illustrates an example in which the non-display area NDA surrounds the display area DA, but the present disclosure is not limited thereto. In another exemplary embodiment, the non-display area NDA may be disposed adjacent only to one side or the other side of the display area DA or may be disposed to one or both sides of the display area DA.

The pad area PA may be defined in the non-display area NDA. In one exemplary embodiment, the pad area PA may be disposed to be spaced apart from the display area DA over the non-display area NDA.

Although not specifically illustrated, a plurality of pads may be disposed in the pad area PA. The plurality of pads may be electrically connected to a flexible printed circuit board FPC that will be described later.

In one exemplary embodiment, the light-blocking area LB of the middle layer ML may overlap with the display area DA and may partially overlap with the entire non-display area NDA except for the pad area PA.

In one exemplary embodiment, the light-blocking area LB may completely cover the display area DA. Also, the light-blocking area LB may partially cover the non-display area NDA. Specifically, the light-blocking area LB may partially cover the entire non-display area NDA except for the pad area PA.

Most of external light provided to the display device according to an exemplary embodiment of the present disclosure is reflected even before arriving at the protective film PF, but some of the external light may cause the wiring patterns of the digitizer, disposed below the protective film PF, to become visible from the outside. On the other hand, in a case where the light-blocking area LB overlaps with the display area DA, external light can be prevented from passing through the protective film PF, and as a result, the wiring patterns of the digitizer can be prevented from becoming visible from the outside.

The light-blocking area LB may not overlap with the pad area PA. In other words, the pad area PA may overlap with the light-transmitting area LT.

If the pad area PA overlaps with the light-blocking area LB, the protective film PF and the display panel P may not be able to be properly aligned in the process of bonding them together. On the other hand, in a case where the pad area PA overlaps with the light-transmitting area LT, as described above, the display panel P can become visible from below the protective film PF, and thus, the protective film PF and the display panel P can be precisely aligned and properly bonded.

The display device according to an exemplary embodiment of the present disclosure may further include the flexible printed circuit board FPC. The flexible printed circuit board FPC may overlap with the pad area PA and may be electrically connected to the pad area PA.

In one exemplary embodiment, as illustrated in FIG. 1, an anisotropic conductive film ACF may be interposed between the flexible printed circuit board FPC and the pad area PA. In other words, the flexible printed circuit board FPC and the pad area PA may be electrically connected by the anisotropic conductive film ACF.

Referring again to FIG. 2, a driving integrated circuit (IC) 350 may be disposed on the flexible printed circuit board FPC. The driving IC 350 may generate signals necessary for driving the display device according to an exemplary embodiment of the present disclosure and may transmit the generated signals to the display area DA. That is, the display device according to an exemplary embodiment of the present disclosure may be a chip-on-film (COF)-type display device.

Referring again to FIG. 1, a third adhesive layer AD3 may be disposed on the display panel P.

The third adhesive layer AD3 may bond the polarizing layer POL and the display panel P together.

In one exemplary embodiment, the third adhesive layer AD3 may comprise a photocurable resin or a thermosetting resin having a high transmittance and an adhesive performance. For example, the third adhesive layer AD3 may be obtained by applying a resin such as an acrylic resin and irradiating the resin with UV light so as to cure the resin.

In one exemplary embodiment, the third adhesive layer AD3 may include a PSA.

In one exemplary embodiment, the third adhesive layer AD3 may include an OCA.

In one exemplary embodiment, the third adhesive layer AD3 may have a thickness of 10 μm to 200 μm.

The polarizing layer POL may be disposed on the third adhesive layer AD3.

The polarizing layer POL may reduce the reflectance of external light incident thereupon from the outside. In one exemplary embodiment, the polarizing layer POL may include a retarder and a polarizer.

In another exemplary embodiment, the polarizing layer POL may not be provided. In this exemplary embodiment, a black matrix (not illustrated) and/or color filters (not illustrated) may be provided to prevent color separation that may be caused by the reflection of external light.

A fourth adhesive layer AD4 may be disposed on the polarizing layer POL. The fourth adhesive layer AD4 may bond the polarizing layer POL and the window W together. In one exemplary embodiment, the fourth adhesive layer AD4 may comprise a photocurable resin or a thermosetting resin having a high transmittance and an adhesive performance. For example, the fourth adhesive layer AD4 may be obtained by applying a resin such as an acrylic resin and irradiating the resin with UV light so as to cure the resin.

In one exemplary embodiment, the fourth adhesive layer AD4 may include a PSA.

In one exemplary embodiment, the fourth adhesive layer AD4 may include an OCA.

In one exemplary embodiment, the fourth adhesive layer AD4 may have a thickness of 10 µm to 200 µm.

The window W may be disposed on the fourth adhesive layer AD4.

In one exemplary embodiment, the window W may be formed of a transparent glass or plastic material. That is, the window W may be formed of a light-transmitting material.

In one exemplary embodiment, the window W may be flexible. In other words, the window W may be formed of a bendable, foldable, or rollable material or have a bendable, foldable, or rollable structure and may thus be bendable, foldable, or rollable.

Display devices according to other exemplary embodiments of the present disclosure will hereinafter be described. Some elements that will hereinafter be described may be substantially the same as their respective counterparts of the display device according to an exemplary embodiment of the present disclosure, and thus, detailed descriptions thereof may be omitted for clarity.

Figure 3:
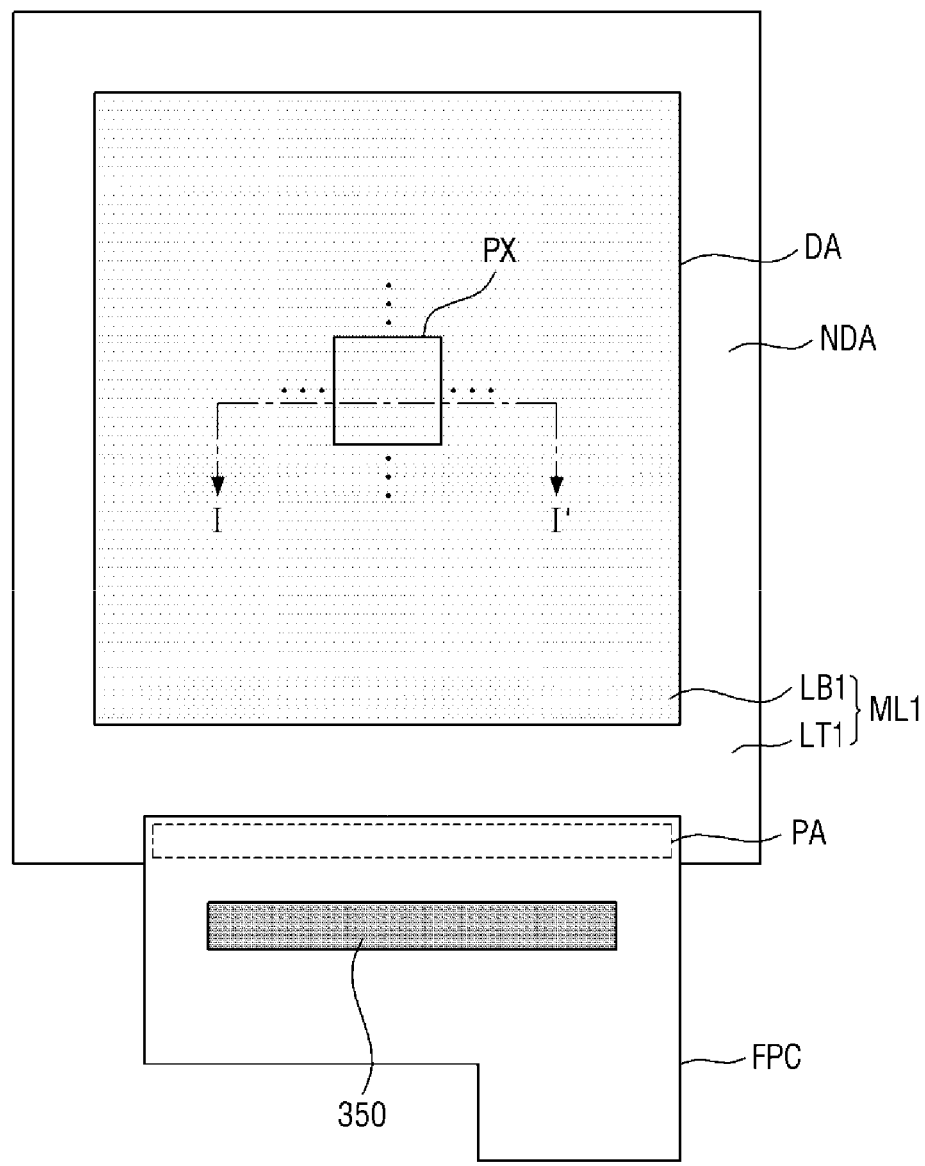
FIG. 3 is a layout view of a display device according to another exemplary embodiment of the present disclosure.

FIG. 3 is a layout view of a display device according to another exemplary embodiment of the present disclosure.

Referring to FIG. 3, a light-blocking area LB1 of a middle layer ML1 may only overlap with a display area DA.

A non-display area NDA may overlap with a light-transmitting area LT1 of the middle layer ML1. Also, a pad area PA may overlap with the light-transmitting area LT1.

As already mentioned above, since the light-blocking area LB1 overlaps with the display area DA, the wiring of a digitizer can be prevented from becoming visible from the outside, and since the light-transmitting area LT1 overlaps with the non-display area NDA, a display panel P can become visible from below a protective film PF during the bonding of the protective film PF and the display panel P, and as a result, the alignment of the protective film PF and the display panel P can be facilitated.

Figure 4:
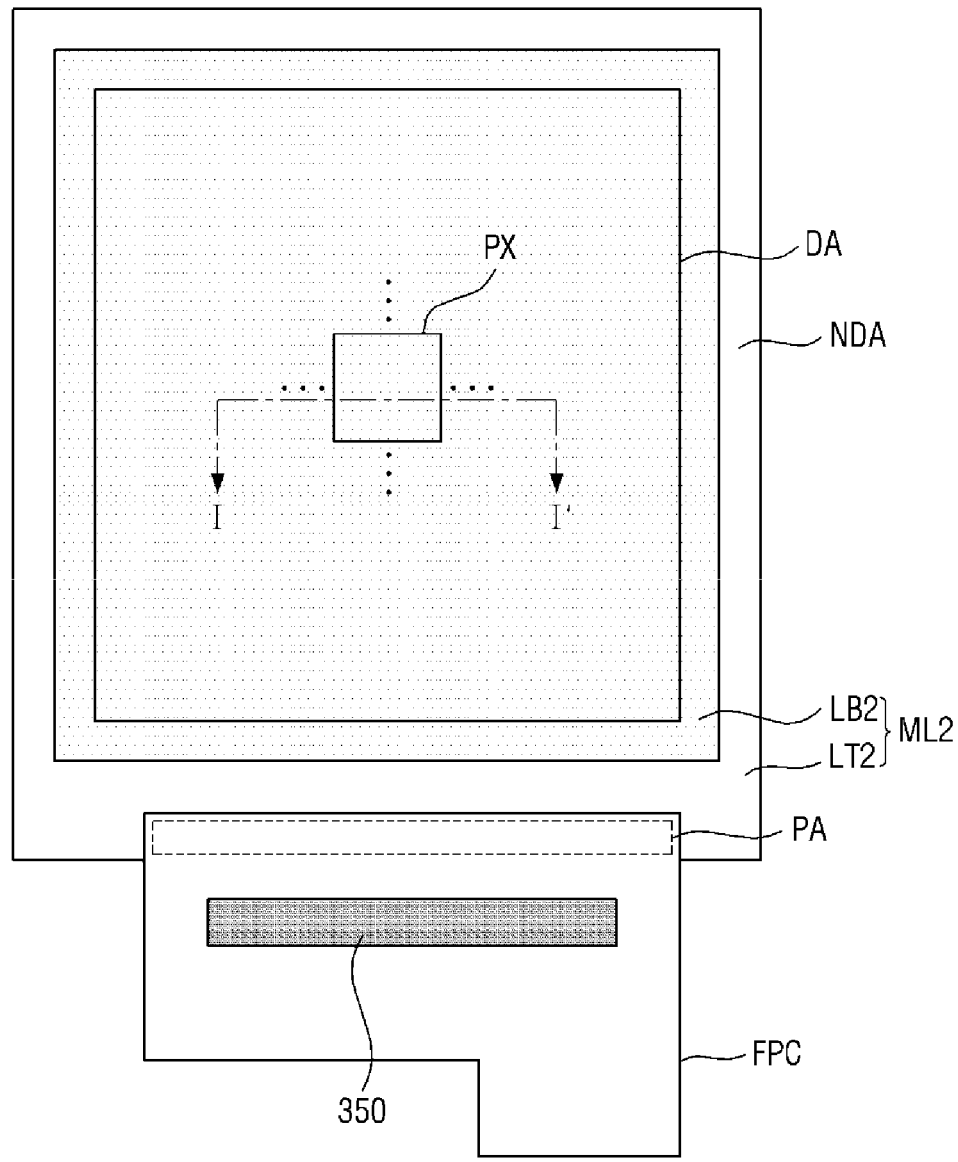
FIG. 4 is a layout view of a display device according to another exemplary embodiment of the present disclosure.

FIG. 4 is a layout view of a display device according to another exemplary embodiment of the present disclosure.

Referring to FIG. 4, a light-blocking area LB2 of a middle layer ML2 may cover a display area DA and part of a non-display area NDA. In the exemplary embodiment of FIG. 4, unlike in the exemplary embodiment of FIG. 2 where the width of the light-blocking area LB is the same as the width of the display panel P, the width of the light-blocking area LB2 is smaller than the width of a display panel P.

That is, in one exemplary embodiment, the outer boundaries of the light-blocking area LB2 may be disposed inside the outer boundaries of the non-display area NDA.

Even in this exemplary embodiment, a pad area PA may overlap with a light-transmitting area LT2 of the middle layer ML2.

Figure 5:
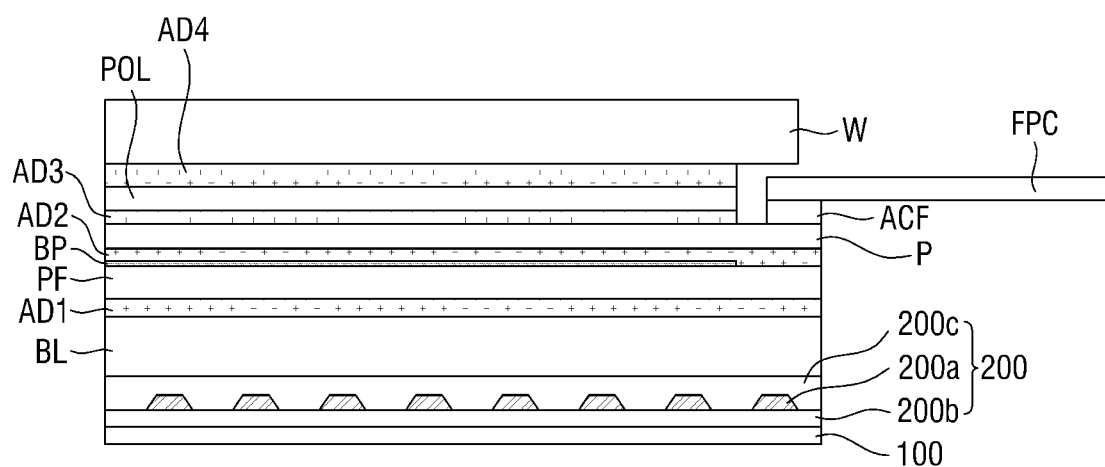
FIG. 5 is a cross-sectional view of a display device according to another exemplary embodiment of the present disclosure.

FIG. 5 is a cross-sectional view of a display device according to another exemplary embodiment of the present disclosure.

Referring to FIG. 5, a light-blocking area of a middle layer may be provided by a light-blocking printed layer BP, and a light-transmitting area of the middle layer may be provided by a second adhesive layer AD2.

In one exemplary embodiment, the light-blocking area may be obtained by disposing the light-blocking printed layer BP on a protective film PF. The light-blocking printed layer BP may be formed on part of the protective film PF. That is, part of the protective film PF where the light-blocking printed layer BP is formed may become the light-blocking area, and part of the protective film PF where the light-blocking printed layer BP is not formed may become the light-transmitting area.

In one exemplary embodiment, the light-blocking printed layer BP may comprise a colored pigment, particularly, a black pigment.

The planar shape of the light-blocking printed layer BP may be substantially the same as the planar shape of the light-blocking area LB, LB1, or LB2 of FIG. 2, 3, or 4.

In one exemplary embodiment, the light-transmitting area may be an area in which the light-blocking printed layer BP is not formed. The area in which the light-blocking printed layer BP is not formed may be filled with the second adhesive layer AD2. As already mentioned above, the second adhesive layer AD2 may be formed of a transparent material. Accordingly, the second adhesive layer AD2 may be able to transmit light therethrough.

The second adhesive layer AD2 may be formed on the light-blocking printed layer BP. The second adhesive layer AD2 may cover the light-blocking printed layer BP and the protective film PF.

The material of the second adhesive layer AD2 may be substantially the same as the material of the second adhesive layer AD2 of any one of the display devices according to the previous exemplary embodiments.

Figure 6:
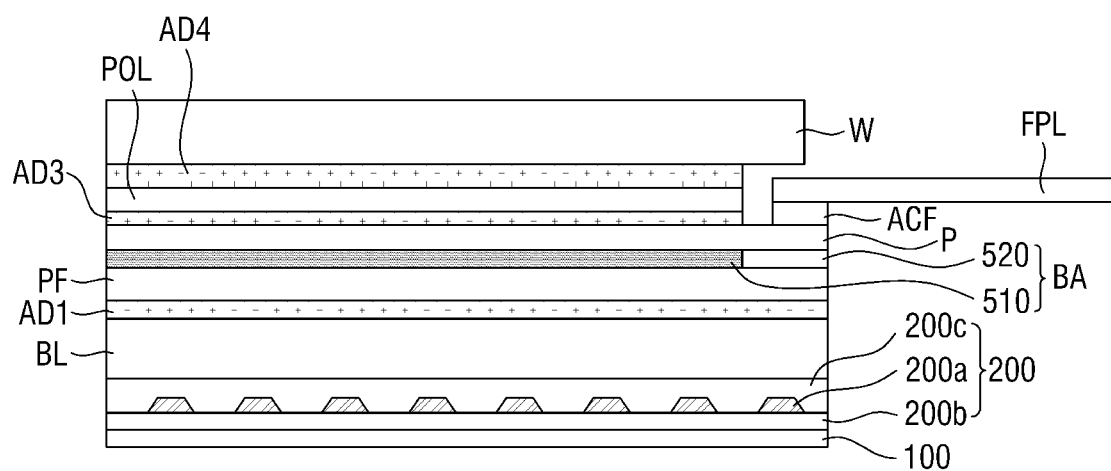
FIG. 6 is a cross-sectional view of a display device according to another exemplary embodiment of the present disclosure.

FIG. 6 is a cross-sectional view of a display device according to another exemplary embodiment of the present disclosure. Referring to FIG. 6, in one exemplary embodiment, a middle layer may be replaced with a light-blocking adhesive layer BA.

In one exemplary embodiment, the light-blocking adhesive layer BA may have a light-blocking area 510 and a light-transmitting area 520.

The light-blocking adhesive layer BA may have an adhesive performance and may be interposed between a display panel P and a protective film PF. That is, the light-blocking adhesive layer BA may bond the display panel P and the protective film PF together, and as a result, no second adhesive layer AD2 may be needed.

That is, one surface of the light-blocking adhesive layer BA may be placed in contact with the protective film PF, and the other surface of the light-blocking adhesive layer BA may be placed in contact with the display panel P.

The light-blocking area 410 of the light-blocking adhesive layer BA may comprise a colored pigment, particularly, a black pigment. Accordingly, the light-blocking area 510 may be able to absorb external light.

The light-transmitting area 520 may be transparent or translucent. That is, the light-transmitting area 520 may be able to transmit external light therethrough.

That is, the light-blocking area LB, LB1, or LB2 of FIG. 2, 3, or 4 may be replaced with the light-blocking area 510, and the light-transmitting area LT, LT1, or LT2 of FIG. 2, 3, or 4 may be replaced with the light-transmitting area 520.

The planar shape of the light-blocking area 510 may be substantially the same as the planar shape of the light-blocking area LB, LB1, or LB2 of FIG. 2, 3, or 4.

Figure 7:
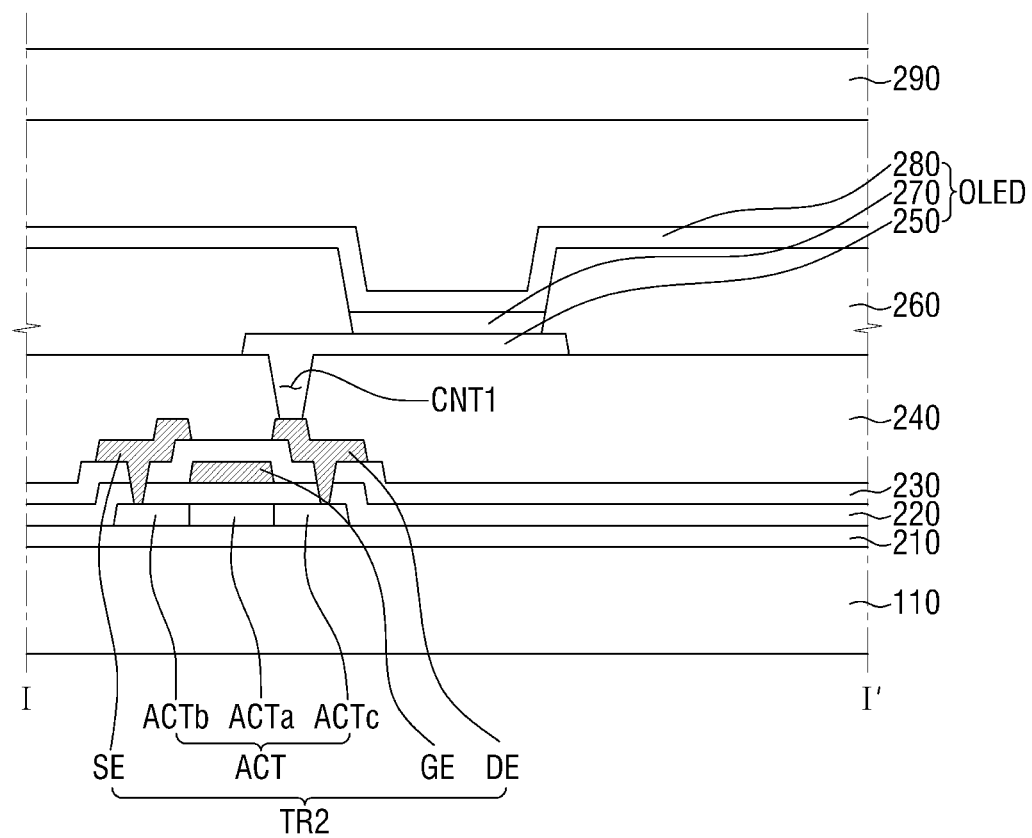
FIG. 7 is a cross-sectional view of a display device taken along line I-I' of FIG. 2 according to an exemplary embodiment of the present disclosure.

FIG. 7 is a cross-sectional view of a display device according to an exemplary embodiment of the present disclosure. Specifically, FIG. 7 is a cross-sectional view taken along line I-I' of FIG. 2.

Referring to FIG. 7, a pixel unit PX may include a buffer layer 210. The buffer layer 210 may be disposed on a first substrate 110. The buffer layer 210 may prevent the infiltration of moisture and oxygen from the outside through the first substrate 110. Also, the buffer layer 210 may planarize the surface of the first substrate 110. In one exemplary embodiment, the buffer layer 210 may include one of a silicon nitride (SiNx) film, a silicon oxide ($SiO_2$) film, and a silicon oxynitride (SiOxNy) film. The buffer layer 210 may not be provided depending on the type of, and the processing conditions for, the first substrate 110.

A semiconductor layer including a semiconductor pattern ACT may be disposed on the buffer layer 210. The semiconductor layer, particularly, the semiconductor pattern ACT, will hereinafter be described. In one exemplary embodiment, the semiconductor pattern ACT may be formed by mixing one or two selected from among polycrystalline silicon, monocrystalline silicon, low-temperature polycrystalline silicon, amorphous silicon, and an oxide semiconductor. In one exemplary embodiment, the semiconductor pattern ACT may include a channel area ACTa, which is not doped with impurities, and source and drain areas ACTb and ACTc, which are doped with impurities. The source area ACTb is disposed on one side of the channel area ACTa and is electrically connected to a source electrode SE, which will be described later. The drain area ACTc is disposed on the other side of the channel area ACTa and is electrically connected to a drain electrode DE, which will be described later.

A first insulating layer 220 may be disposed on the semiconductor layer including the semiconductor pattern ACT. In one exemplary embodiment, the first insulating layer 220 may be a gate insulating layer. In one exemplary embodiment, the first insulating layer 220 may be formed by mixing at least one selected from the group consisting of an inorganic insulating material such as SiOx or SiNx and an organic insulating material such as benzocyclobutene (BCB), an acrylic material, or polyimide (PI).

A gate conductor including a gate electrode GE may be disposed on the first insulating layer 220. The gate electrode GE may overlap with the semiconductor pattern ACT. The gate conductor may comprise at least one of an aluminum (Al)-based metal including an Al alloy, an Ag-based metal including an Ag alloy, a Cu-based metal including a Cu alloy, a molybdenum (Mo)-based metal including a Mo alloy, chromium (Cr), titanium (Ti), and tantalum (Ta).

A second insulating layer 230 may be disposed on the gate conductor including the gate electrode GE. The second insulating layer 230 may be formed by mixing at least one selected from the group consisting of an inorganic insulating material such as silicon oxide (SiOx) or SiNx and an organic insulating material such as BCB, an acrylic material, or PI.

A data conductor including the source electrode SE and the drain electrode DE may be disposed on the second insulating layer 230. The source electrode SE and the drain electrode DE may be disposed on the second insulating layer 230 to be spaced apart from each other. The data conductor may comprise at least one selected from the group consisting of a metal, an alloy, a metal nitride, a conductive metal oxide, and a transparent conductive material. In one exemplary embodiment, the data conductor may comprise Ni, cobalt (Co), Ti, Ag, Cu, Mo, Al, beryllium (Be), niobium (Nb), Au, iron (Fe), selenium (Se), or Ta and may have a single- or multilayer structure. Alternatively, an alloy of at least one selected from the group consisting of Ti, zirconium (Zr), W, Ta, Nb, platinum (Pt), hafnium (Hf), oxygen (O), and nitrogen (N) may be used as the material of the source electrode SE and the drain electrode DE.

The semiconductor pattern ACT, the gate electrode GE, the source electrode SE, and the drain electrode DE may form a switching element TR2. FIG. 3 illustrates an example in which the switching element TR2 is of a top-gate-type, but the present disclosure is not limited thereto. That is, alternatively, the switching element TR2 may be of a bottom-gate-type.

A planarization layer 240 may be disposed on the data conductor. The planarization layer 240 eliminates any height difference therebelow and can thus improve the emission efficiency of a pixel electrode 250 and an organic light-emitting layer 270, which will be described later. In one exemplary embodiment, the planarization layer 240 may comprise an organic material. In one example, the planarization layer 240 may comprise at least one selected from among PI, polyacryl, and polysiloxane. In another example, the planarization layer 240 may comprise an inorganic material or the combination of an inorganic material and an organic material. A first contact hole CNT1 may be formed in the planarization layer 240 to at least partially expose the drain electrode DE.

The pixel electrode 250 may be disposed on the planarization layer 240. The pixel electrode 250 may be electrically connected to part of the drain electrode DE exposed by the first contact hole CNT1. That is, the pixel electrode 250 may be an anode, which is a hole injection electrode. In a case where the pixel electrode 250 is an anode electrode, the pixel electrode 250 may comprise a material having a high work function so as to facilitate the injection of holes. Also, the pixel electrode 250 may be a reflective electrode, a transflective electrode, or a transmissive electrode. In one exemplary embodiment, the pixel electrode 250 may comprise a reflective material. In one exemplary embodiment, the reflective material may include at least one selected from the group consisting of Ag, magnesium (Mg), Cr, Au, Pt, Ni, Cu, W, Al, Al-lithium (Al—Li), Mg-indium (Mg—In), and Mg—Ag.

In one exemplary embodiment, the pixel electrode 250 may be formed as a single layer, but the present disclosure is not limited thereto. That is, alternatively, the pixel electrode 250 may be formed as a multilayer having a stack of two different materials.

In one exemplary embodiment, in a case where the pixel electrode 250 is formed as a multilayer, the pixel electrode 250 may include a reflective film and a transparent or transflective electrode disposed on the reflective film. In another exemplary embodiment, the pixel electrode 250 may include a reflective film and a transparent or transflective electrode disposed below the reflective film. For example, the pixel electrode 250 may have a triple-layer structure of indium tin oxide (ITO)/Ag/ITO, but the present disclosure is not limited thereto.

Here, the transparent or transflective electrode may comprise at least one selected from the group consisting of ITO, indium zinc oxide (IZO), zinc oxide (ZnO), indium oxide ($In_2O_3$), indium gallium oxide (IGO), and aluminum zinc oxide (AZO).

A pixel defining film 260 may be disposed on the pixel electrode 250. The pixel defining film 260 may include an opening, which at least partially exposes the pixel electrode 250. The pixel defining film 260 may comprise an organic material or an inorganic material. In one exemplary embodiment, the pixel defining film 260 may comprise photoresist, a PI-based resin, an acrylic resin, a silicon compound, or a polyacrylic resin.

The organic light-emitting layer 270 may be disposed on the pixel electrode 250 and the pixel defining film 260. Specifically, the organic light-emitting layer 270 may be disposed on part of the pixel electrode 250 exposed by the opening of the pixel defining film 260. In one exemplary embodiment, the organic light-emitting layer 270 may at least partially cover the sidewalls of the pixel defining film 260.

In one exemplary embodiment, the organic light-emitting layer 270 may emit one of red, blue, and green colors. In another exemplary embodiment, the organic light-emitting layer 270 may emit a white color or one of cyan, magenta, and yellow colors. In a case where the organic light-emitting layer 270 emits a white color, the organic light-emitting layer 270 may comprise a white light-emitting material or may have a stack of red, green, and blue light-emitting layers.

A common electrode 280 may be disposed on the organic light-emitting layer 270 and the pixel defining film 260. In one exemplary embodiment, the common electrode 280 may be formed on the entire surfaces of the organic light-emitting layer 270 and the pixel defining film 260. In one exemplary embodiment, the common electrode 280 may be a cathode. In one exemplary embodiment, the common electrode 280 may comprise at least one selected from the group consisting of Li, calcium (Ca), lithium fluoride (LiF)/Ca, LiF/Al, Al, Ag, and Mg. The common electrode 280 may be formed of a material with a low work function. In one exemplary embodiment, the common electrode 280 may be a transparent or transflective electrode formed of at least one selected from the group consisting of ITO, IZO, ZnO, $In_2O_3$, IGO, and AZO.

The pixel electrode 250, the organic light-emitting layer 270, and the common electrode 280 may form an organic light-emitting diode (OLED) "OLED", but the present disclosure is not limited thereto. That is, the OLED "OLED" may have a multilayer structure including a hole injection layer (HIL), a hole transport layer (HTL), an electron transport layer (ETL), and an electron injection layer (EIL).

A second substrate 290 may be disposed to face the first substrate 110. The second substrate 290 may be coupled to the first substrate 110 via an additional sealing member. In one exemplary embodiment, the second substrate 290 may be a transparent insulating substrate. In a case where the second substrate 290 is a transparent insulating substrate, the transparent insulating substrate may be a glass substrate, a quartz substrate, or a transparent resin substrate.

Figure 8:
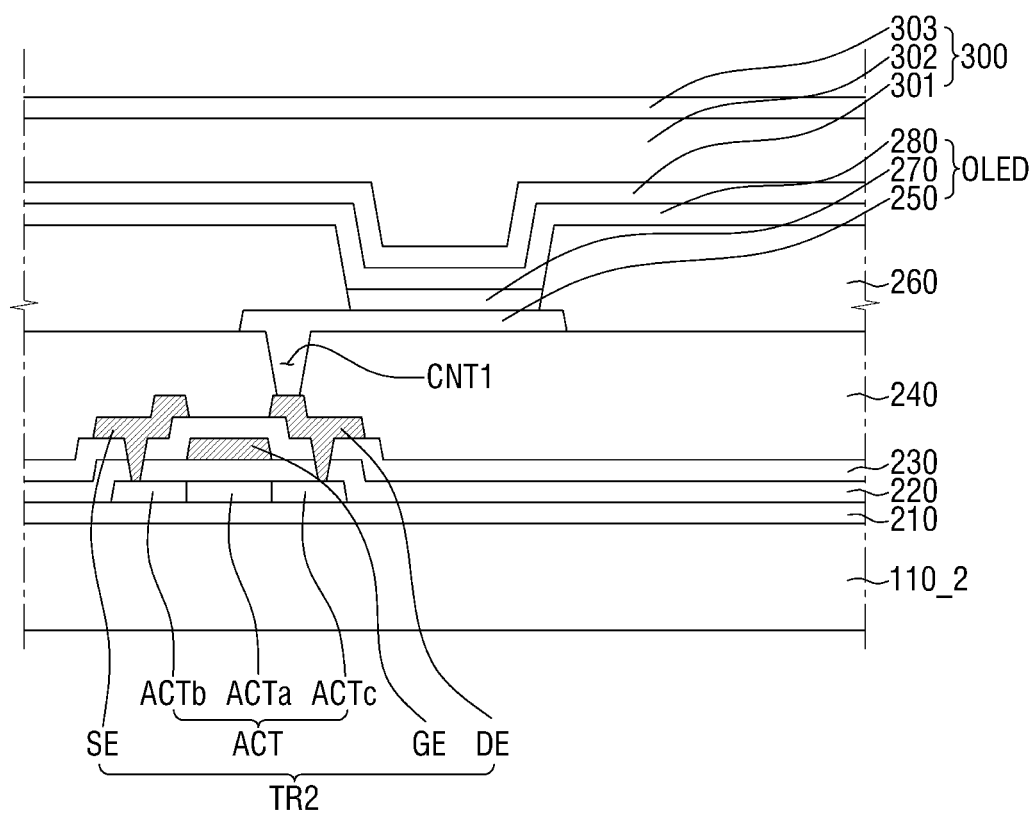
FIG. 8 is a cross-sectional view of a display device according to another exemplary embodiment of the present disclosure.

FIG. 8 is a cross-sectional view of a display device according to another exemplary embodiment of the present disclosure. Specifically, FIG. 8 illustrates a modified example of the display device of FIG. 7.

Referring to FIG. 8, in one exemplary embodiment, an encapsulation layer 300 may be disposed on a first substrate 110_2.

The encapsulation layer 300 may prevent the infiltration of moisture and air from the outside into an OLED "OLED". In one exemplary embodiment, the encapsulation layer 300 may include a first inorganic layer 301, an organic layer 302, and a second inorganic layer 303.

The first inorganic layer 301 may be disposed on a common electrode 280. The first inorganic layer 301 may comprise at least one selected from the group consisting of SiOx, SiNx, and SiONx.

The organic layer 302 may be disposed on the first inorganic layer 301. The organic layer 302 may comprise one selected from the group consisting of epoxy, acrylate, and urethane acrylate. The organic layer 302 may planarize a height difference formed by a pixel defining film 260.

The second inorganic layer 303 may be disposed on the organic layer 302. The second inorganic layer 303 may comprise at least one selected from the group consisting of SiOx, SiNx, and SiONx.

FIG. 8 illustrates an example in which the first inorganic layer 301, the organic layer 302, and the second inorganic layer 303 are all single layers, but the present disclosure is not limited thereto. That is, alternatively, at least one of the first inorganic layer 301, the organic layer 302, and the second inorganic layer 303 may have a multilayer structure.

In another exemplary embodiment, the encapsulation layer 300 may include a hexamethyldisiloxane (HMDSO) layer. Specifically, the encapsulation layer 300 may include a first inorganic layer 301, a second inorganic layer 303, and the HMDSO layer, which is disposed between the first and second inorganic layers 301 and 303. That is, the organic layer 302 may be replaced with the HMDSO layer.

In one exemplary embodiment, the HMDSO layer may be formed in the same chamber as the first inorganic layer 301 after the formation of the first inorganic layer 301. In this manner, the formation of the encapsulation layer 300 can be simplified. Also, since the HMDSO layer, which is capable of absorbing stress, is included in the encapsulation layer 300, the encapsulation layer 300 may become sufficiently flexible.

Methods of manufacturing a display device according to exemplary embodiments of the present disclosure will hereinafter be described. Some elements that will hereinafter be described may be substantially the same as their respective counterparts of any one of the display devices according to the above-described exemplary embodiments, and thus, detailed descriptions thereof may be omitted for clarity.

Figure 9:
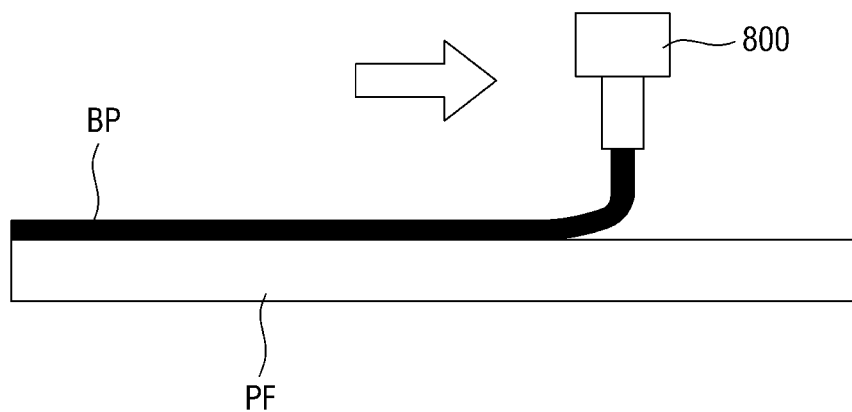
FIG. 9 is a cross-sectional view illustrating a method of manufacturing a display device according to an exemplary embodiment of the present disclosure.
Figure 10:
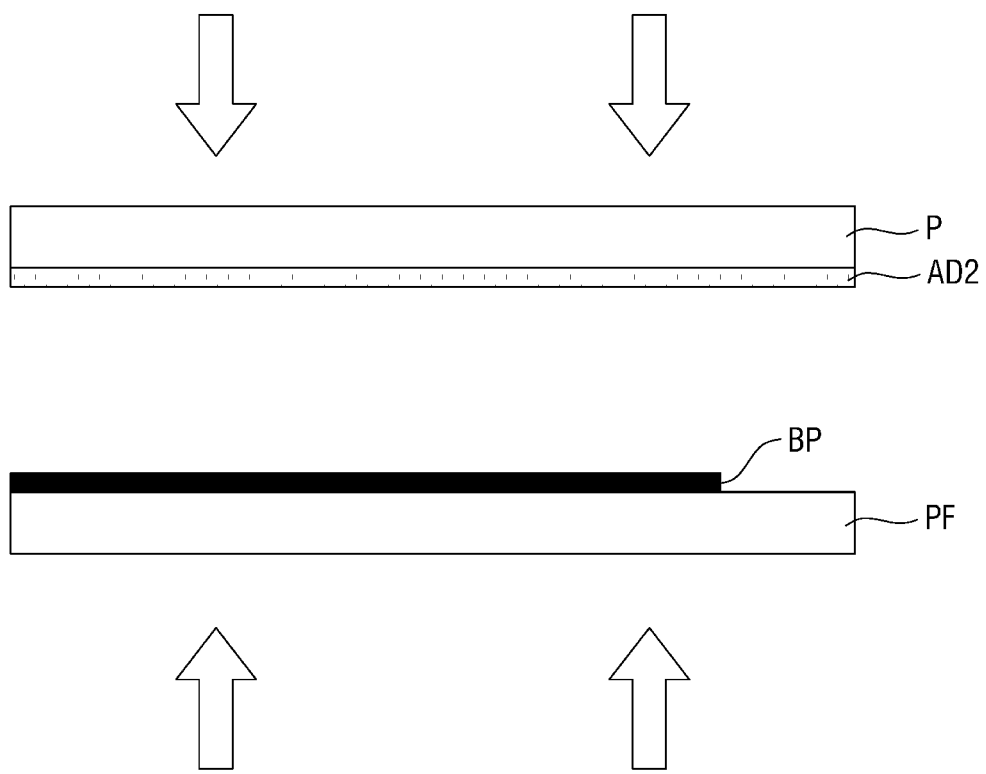
FIG. 10 is a cross-sectional view illustrating the method of manufacturing a display device according to an exemplary embodiment of the present disclosure.

FIG. 9 is a cross-sectional view illustrating a method of manufacturing a display device according to an exemplary embodiment of the present disclosure. FIG. 10 is a cross-sectional view illustrating the method of manufacturing a display device according to an exemplary embodiment of the present disclosure.

Referring to FIGS. 9 and 10, the method of manufacturing a display device according to an exemplary embodiment of the present disclosure may include forming a middle layer, which has a light-blocking area and a light-transmitting area, on a protective film PF and bonding the protective film PF and a display panel P together.

The forming of the middle layer may include forming a light-blocking printed layer BP on the protective film PF. The light-blocking printed layer BP may comprise a colored pigment, particularly, a black pigment. In one exemplary embodiment, the light-blocking printed layer BP may be formed by printing or spraying.

FIG. 9 illustrates how to form the light-blocking printed layer BP through printing using a nozzle 800.

As already mentioned above with reference to FIG. 5, the light-blocking printed layer BP may be formed on part of the protective film PF.

That is, part of the protective film PF where the light-blocking printed layer BP is formed may form a light-blocking area, and part of the protective film PF where the light-blocking printed layer BP is not formed may form a light-transmitting area.

Thereafter, referring to FIG. 10, the bonding of the protective film PF and the display panel P may be performed. The bonding of the protective film PF and the display panel P may include interposing a second adhesive layer AD2 between the protective film PF and the display panel P. The second adhesive layer AD2 may be formed on the display panel P and/or on the protective film PF.

Thereafter, the protective film PF and the display panel P may be brought close to each other and may then be bonded together. As already mentioned above, the display panel P can be viewed through the light-transmitting area (i.e., the part of the protective film PF where the light-blocking printed layer BP is not formed), even from below the protective film PF, and as a result, the display panel P and the protective film PF can be properly bonded together while being precisely aligned with each other.

A display device obtained by the method of manufacturing a display device according to an exemplary embodiment of the present disclosure may be substantially the same as any one of the display devices according to the abovementioned exemplary embodiments. Steps of the method of manufacturing a display device according to an exemplary embodiment of the present disclosure that have not been described may be performed in well-known manners.

Figure 11:
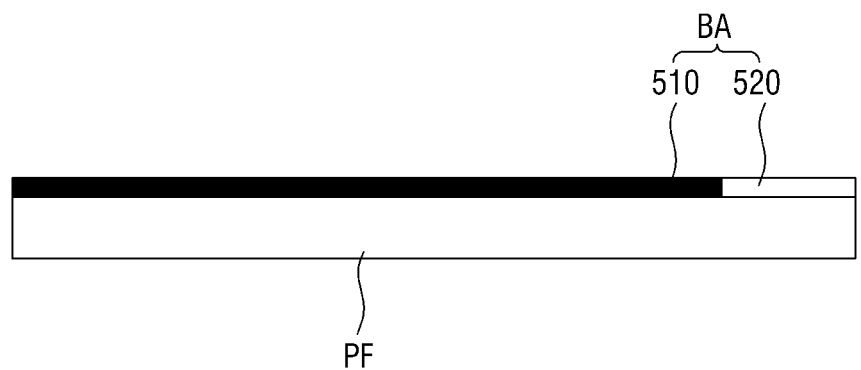
FIG. 11 is a cross-sectional view illustrating a method of manufacturing a display device according to another exemplary embodiment of the present disclosure.
Figure 12:
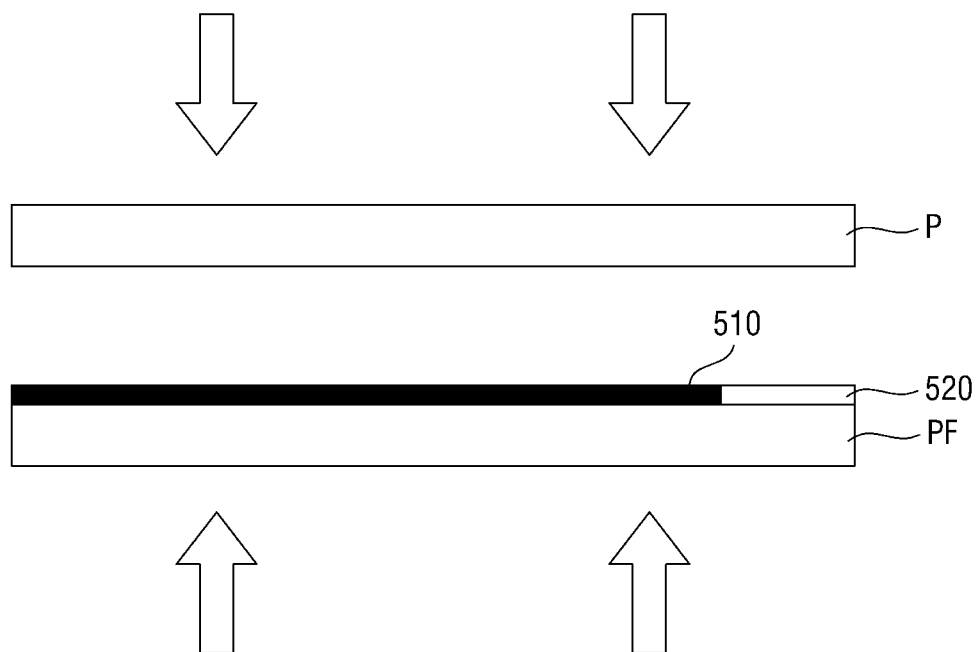
FIG. 12 is a cross-sectional view illustrating the method of manufacturing a display device according to another exemplary embodiment of the present disclosure.

FIG. 11 is a cross-sectional view illustrating a method of manufacturing a display device according to another exemplary embodiment of the present disclosure. FIG. 12 is a cross-sectional view illustrating the method of manufacturing a display device according to another exemplary embodiment of the present disclosure.

The exemplary embodiment of FIGS. 11 and 12 differs from the exemplary embodiment of FIGS. 9 and 10 in that a light-blocking adhesive layer BA is formed as a middle layer.

Referring to FIG. 11, the light-blocking adhesive layer BA may be formed on a protective film PF. The light-blocking adhesive layer BA may have a light-blocking area 510 and a light-transmitting area 520. The light-blocking area 510 and the light-transmitting area 520 may be substantially the same as their respective counterparts of FIG. 6.

Thereafter, referring to FIG. 12, the bonding of the protective film PF and a display panel P may be performed. The light-blocking adhesive layer BA may have an adhesive performance and may thus be able to bond the protective film PF and the display panel P together. That is, in the exemplary embodiment of FIGS. 11 and 12, unlike in the exemplary embodiment of FIGS. 9 and 10, a second adhesive layer AD2 may not be provided.

However, the effects of the present inventive concept are not restricted to the one set forth herein. The above and other effects of the present inventive concept will become more apparent to one of daily skill in the art to which the present inventive concept pertains by referencing the claims.

While the present inventive concept has been particularly illustrated and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A display device comprising:
a display panel having a display area and a pad area, the pad area being spaced apart from the display area, wherein an image is displayed on a first surface of the display panel;
a window disposed on the first surface of the display panel;
a protective film disposed on a second surface of the display panel which is opposite to the first surface of the display panel; and
a middle layer interposed between the protective film and the second surface of the display panel,
wherein
the middle layer has a light-blocking area and a light-transmitting area,
the light-blocking area overlaps the display area,
the light-transmitting area configured to selectively transmit visible ray overlaps the pad area, and
the display panel overlaps the light-blocking area and the light-transmitting area.

2. The display device of claim 1, wherein
the display panel further includes a non-display area that is disposed outside the display area, and
the light-blocking area partially covers the non-display area.

3. The display device of claim 2, wherein outer boundaries of the light-blocking area are disposed inside outer boundaries of the non-display area.

4. The display device of claim 1, wherein the light-blocking area only overlaps the display area.

5. The display device of claim 1, wherein the light-blocking area includes a light-blocking printed layer that is formed on the protective film.

6. The display device of claim 5, wherein the light-blocking printed layer comprises a black pigment.

7. The display device of claim 5, further comprising:
an adhesive layer covering the light-blocking printed layer and the protective film,
wherein the light-transmitting area is provided by the adhesive layer.

8. The display device of claim 1, wherein
the middle layer includes a light-blocking adhesive layer, and
the light-blocking adhesive layer includes a light-transmitting area corresponding to the light-transmitting area of the middle layer and a light-blocking area corresponding to the light-blocking area of the middle layer.

9. The display device of claim 8, wherein
one surface of the light-blocking adhesive layer is placed in contact with the protective film, and
the other surface of the light-blocking adhesive layer is placed in contact with the display panel.

10. The display device of claim 1, further comprising:
an impact absorbing layer disposed on one surface of the protective film.

11. The display device of claim 10, further comprising:
an adhesive layer disposed between the impact absorbing layer and the protective film, wherein
one surface of the adhesive layer is placed in contact with the impact absorbing layer, and
the other surface of the adhesive layer is placed in contact with the protective film.

12. The display device of claim 1, wherein the light-transmitting area has a light transmittance of 50% or higher for light having a wavelength of 550 nm.

13. The display device of claim 1, wherein the light-blocking area has a light transmittance of 10% or lower for light having a wavelength of 550 nm.

* * * * *